United States Patent
Jue et al.

(10) Patent No.: US 6,775,814 B1
(45) Date of Patent: Aug. 10, 2004

(54) DYNAMIC SYSTEM CONFIGURATION FOR FUNCTIONAL DESIGN VERIFICATION

(75) Inventors: Darren S. Jue, Sunnyvale, CA (US); Maximilian Schuetz, San Francisco, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/561,814

(22) Filed: Apr. 29, 2000

(51) Int. Cl.[7] ............................................. G06F 17/50
(52) U.S. Cl. ...................................................... 716/18
(58) Field of Search ........................ 716/1–21; 717/7; 714/731; 712/1, 13, 208; 703/14, 15; 382/304; 326/40, 41

(56) References Cited

U.S. PATENT DOCUMENTS 6,226,776 B1 * 5/2001 Panchul et al. ................ 716/3
6,321,366 B1 * 11/2001 Tseng et al. .................... 716/6

* cited by examiner

Primary Examiner—Vuthe Siek
Assistant Examiner—Naum Levin

(57) ABSTRACT

A mechanism is disclosed which permits dynamic reconfiguration of RTL implemented objects in a circuit simulation circuit employing high level language interfaces to redirect communication between RTL objects within a configuration. The high level language interface presents a mechanism for changing a configuration more rapidly and more conveniently than reconstructing the configuration by the RTL links between the various objects in the configuration. A method for building a configuration employing high level language interfaced RTL objects is also disclosed.

20 Claims, 8 Drawing Sheets

DYNAMIC SYSTEM CONFIGURATION FOR FUNCTIONAL DESIGN VERIFICATION

BACKGROUND

When simulating the interconnection of computer chips including Application Specific Integrated Chips (ASICs), it has been common in the prior art to employ Hardware Design Languages (HDL) to implement Register Transfer Logic (RTL) for simulating various devices. Generally, HDL is employed to simulate the operation of individual chips as well as to interconnect the chips for simulation operations.

Generally, implementation of the chip and interconnection in HDL is highly demanding of both computer memory and execution time causing simulation of large systems employing HDL may be very slow to compile and execute. Since computational resources and time may be limited, the slowness of compilation and execution of system designs employing HDL may prevent complete system testing from being accomplished. On occasion, short-cuts may be employed, such as executing a compilation employing only a subset of a particular chip. Such short-cuts may compromise the quality and accuracy of simulation of an overall system.

Because of the demands upon time and computational resources of HDL simulation, system simulations are generally limited to the most common sequences of operation of the chips and the overall system being simulated, thereby commonly preventing simulation of "deep corner" cases, or less common system conditions. Simulation under such conditions may produce an incomplete picture of system operation.

Due to the nature of HDL coding and simulation, modifying a set of interconnections between chips in a system generally requires that a programmer spend a considerable amount of time modifying the system configuration in HDL. Once the changes to HDL code have been input, substantial time will then generally be spent recompiling the modified HDL system representation. The time required for system redesign and recompilation when employing HDL generally discourages testing a substantial range of system configurations, thereby making the HDL approach to simulation a relatively static one.

Therefore, it is a problem in the art that HDL simulation is very computationally demanding.

It is a further problem in the art that extensive redesign and recompilation time is required to modify a system configuration when employing HDL.

It is a still further problem in the art that the extensive demands of HDL simulation generally restricts the amount of system testing and the variation in system configurations likely to be tested when employing HDL simulation.

SUMMARY OF THE INVENTION

These and other objects, features and technical advantages are achieved by a system and method which operates to insert high level language (HLL) interfaces in between RTL simulations of ASICs or other chips and optionally HLL emulations of selected ASICs to enable rapid and dynamic system reconfiguration employing a HLL. The substitution of high level language code (such as, for instance, "C" language code) for RTL interconnection logic preferably operates to permit a programmer to use a more convenient and flexible mechanism to reconfigure a system for subsequent simulation.

In selected instances, HLL code may be employed to emulate an entire chip, particularly where an RTL simulation for a particular chip does not already exist. Generally, HLL emulation is more rapid and flexible to implement but somewhat less accurate than RTL simulation of the same chip. However, HLL implementation of interconnection of the RTL-simulated ASICs (or other circuit devices) is generally as accurate as RTL implementation of the same interconnection. In a preferred embodiment, by employing RTL code for simulating individual ASICs, and HLL code for flexibly interconnecting the RTL simulated ASICs, improved simulation flexibility and execution speed may be obtained while preserving simulation accuracy.

A system and method for building and connecting the various HLL and RTL components of a configuration is also provided. For a given set of nodes in a configuration, dynamic configuration code is provided which preferably builds each node in the configuration according to a specification for that node. The dynamic configuration code then preferably follows links from the built node to neighboring nodes to identify remaining unbuilt nodes in the configuration and build nodes as needed. This process preferably continues until all nodes in the configuration have been built. The dynamic configuration code also preferably copies interface pointers for each node as needed in order to ensure that data may be effectively routed through the configuration.

Therefore, it is an advantage of a preferred embodiment of the present invention that interconnections between chips in a system under simulation testing may be readily, flexibly, and rapidly modified.

It is a further advantage of a preferred embodiment of the present invention that more rapid simulation of systems may enable a greater of number of situations to be tested for a particular system configuration.

It is a still further advantage of a preferred embodiment of the present invention that more rapid simulation of systems may enable a greater number of system configurations to be tested before a system is scheduled for fabrication.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
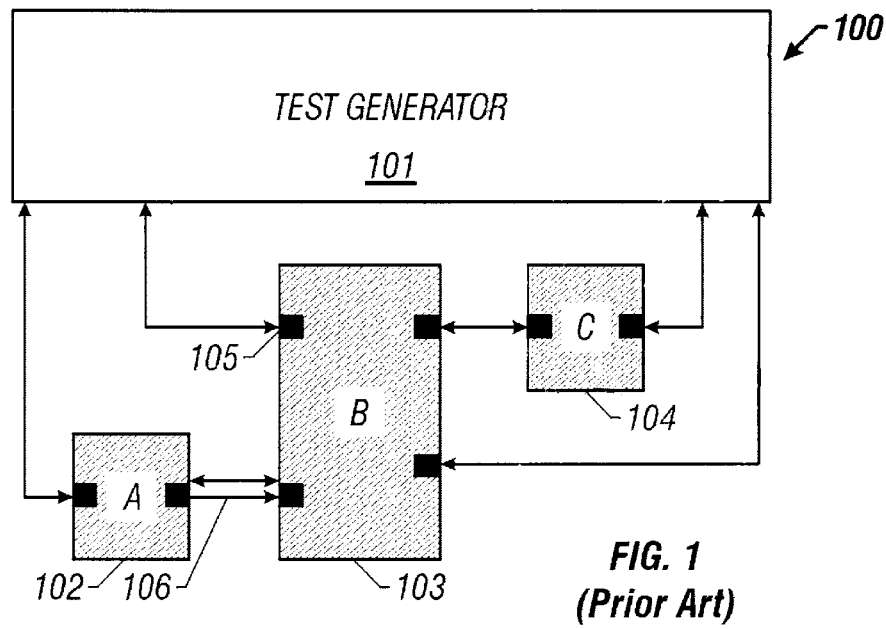
FIG. 1 depicts a circuit simulation configuration according to a the prior art implementation.

FIG. 1 depicts a circuit simulation configuration 100 according common in the prior art. RTL objects A 102, B 103, and C 104, which generally represent RTL simulations of ASICs or other devices are shown directly connected to each other according to prior art RTL interconnection practice. A plurality of RTL ports 105 are generally employed for connection of RTL objects to other RTL objects and, optionally, to test generator 101 which may be implemented in a high level language, such as, for instance, the "C" language. It may be seen that in FIG. 1, the interconnection of the various RTL objects is accomplished employing direct RTL to RTL links. Although the combination of objects A 102, B 103, and C 104 may be connected to a high level language interface, such as in test generator 101, the prior art generally does not permit high level language code to affect the configuration or interconnection of the various RTL objects. In the prior art, the high level language interface is generally only present at a periphery of an interconnected group of RTL objects.

Figure 2:
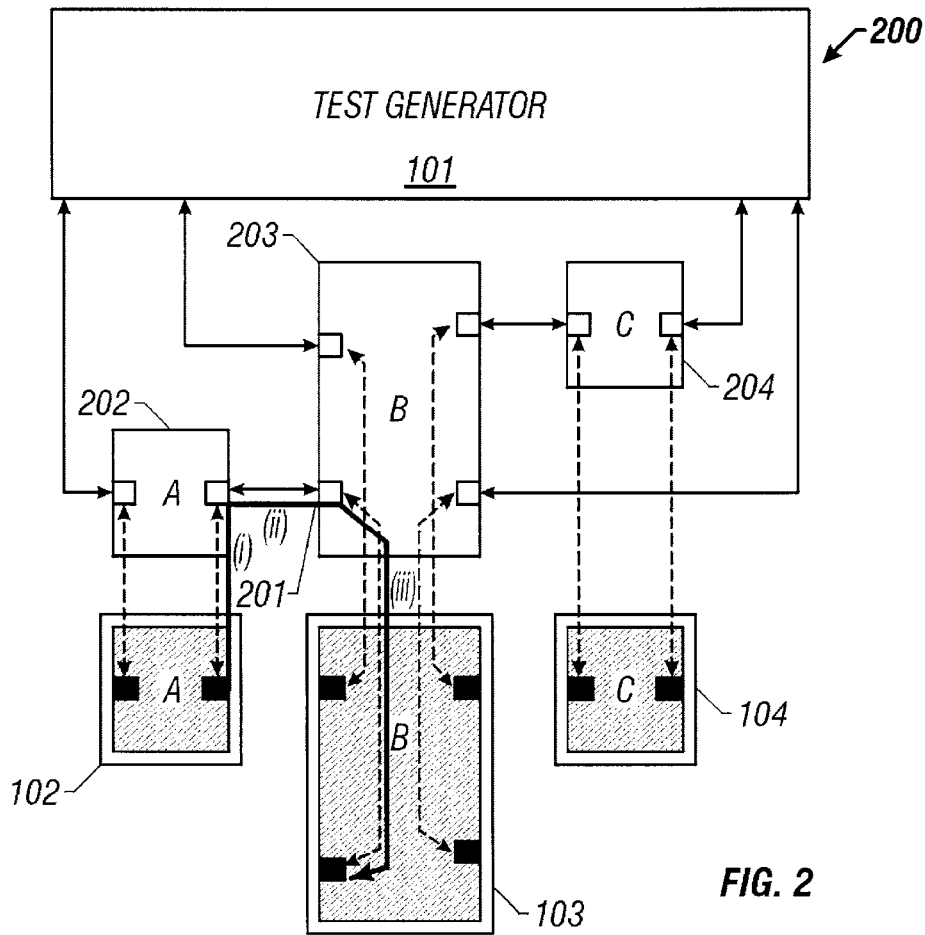
FIG. 2 depicts a circuit simulation configuration employing high level language wrappers according to a preferred embodiment of the present invention.

FIG. 2 depicts a circuit simulation configuration 200 employing high level language wrappers according to a preferred embodiment of the present invention. The embodiment of FIG. 2 generally depicts a simulation configuration in which data being communicated between RTL objects is preferably routed through high level language wrappers and then delivered to an intended RTL object destination.

In a preferred embodiment, this approach preferably provides flexibility in the configuration of the circuit being tested by enabling interconnections between the RTL objects to be readily modified employing high level language code. Herein, the term high level language wrapper, or interface, generally refers to high level language code which communicates with a port on an RTL object and which is able to conduct bi-directional communication with that port. High level language code may also be employed in test generator 101 which generally operates at the periphery of the simulated circuit. Example data path 201 depicts an exemplary redirection of a data communication path through a sequence of high level language wrappers. In FIG. 1, RTL object A 102 and RTL object B 103 communicated bidirectionally along path 106. As depicted in FIG. 2, the communication path between RTL object A 102 and RTL object B 103 (in the B to A direction) now travels through object B HLL wrapper 203, object A HLL wrapper 202, and finally to RTL object A 102. It will be appreciated that the reverse path of the above, from RTL object A 102 to RTL object B 103, is analogously directed through HLL wrappers 202 and 203 before reaching RTL object B 103. Other RTL object to RTL object communication in the configuration of FIG. 2 is preferably redirected as described above in connection with the communication between RTL object A 102 and RTL object B 103. However, direct connection of RTL ports which bypasses HLL wrappers is preferably also available in the embodiment of FIG. 2.

In a preferred embodiment, HLL wrapper B 203 and HLL wrapper A 202 are appropriately programmed so as to direct communication passing through these wrappers to be appropriately directed to a final destination. Where a circuit configuration revision is desired, the HLL wrappers disposed in between two RTL objects are preseferably reprogrammed to direct data received from the various RTL objects according to circuit connections consistent with the revised circuit configuration. Preferably, such a change may be more easily and rapidly accomplished employing the high level language code used in the HLL wrappers in the embodiment of FIG. 2 than by modifying the direct RTL interconnections depicted in the embodiment of FIG. 1.

Figure 3:
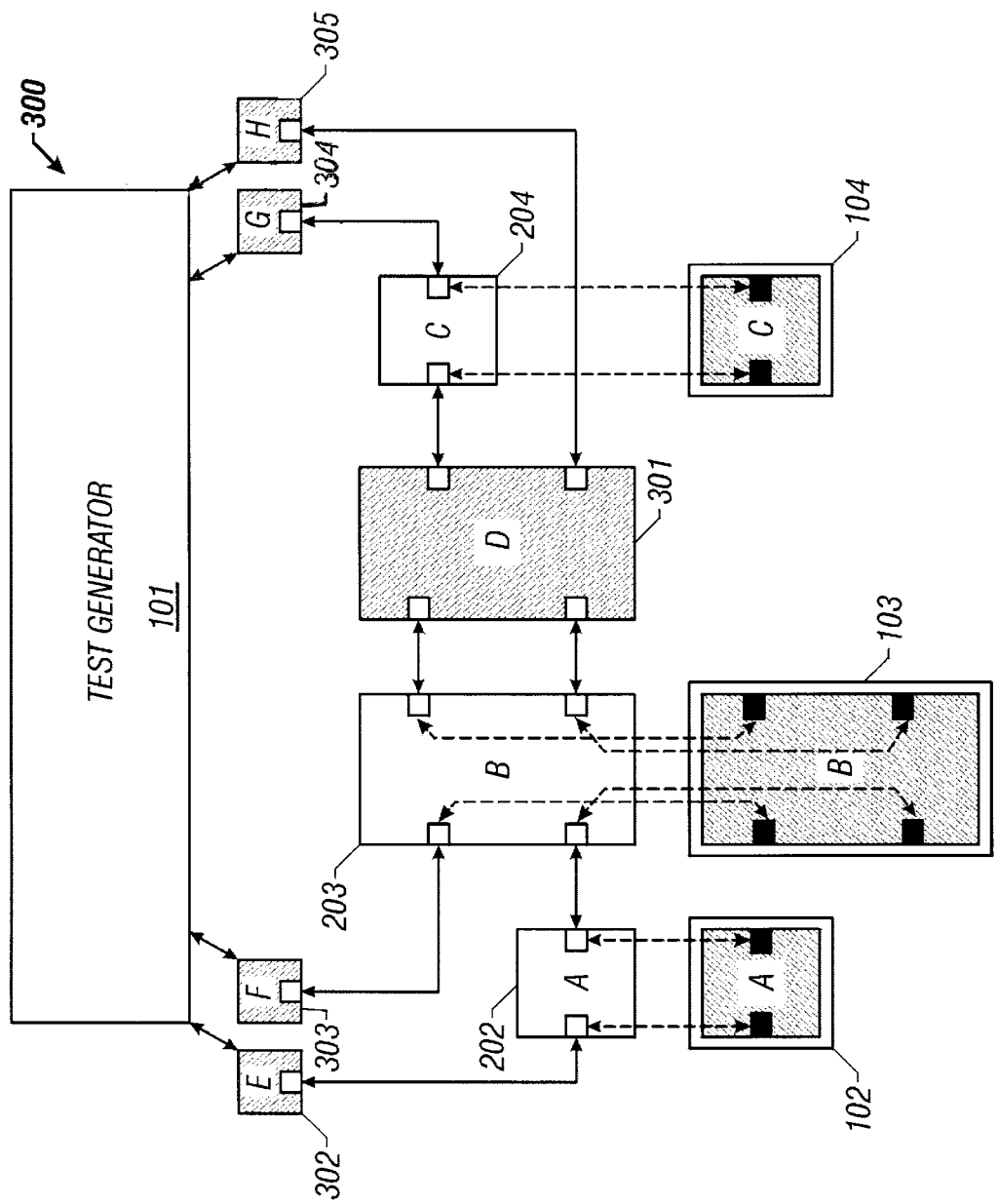
FIG. 3 depicts a circuit simulation configuration including high level language objects according to a preferred embodiment of the present invention.

FIG. 3 depicts a circuit simulation configuration 300 including high level language objects according to a preferred embodiment of the present invention. By using RTL objects having HLL wrappers or interfaces as described in connection with FIG. 2, objects emulated in HLL may generally be readily added to any part of the configuration. In certain cases, recompilation may not be necessary in order to introduce HLL objects since certain high level languages, such as C++, support dynamic allocation. An HLL Object generally refers to an ASIC or other chip emulated employing a high level language. Thus, in this case, the high level language function is preferably extended from merely interconnecting RTL objects to actually emulating the function of an ASIC or other device.

In a preferred embodiment, HLL objects such as emulators may be added to a configuration in order to provide for more effective and varied testing of the RTL simulated ASICs under test. An HLL object is generally an element in the configuration which is entirely implemented in a high level language rather than a combination of RTL and a high level language. The performance impact of adding HLL emulators, or HLL objects, is generally negligible since the execution speed of the HLL emulators is generally much greater than that of RTL simulated ASICs (RTL objects). Generally, HLL objects may be added wherever there is a compatible interface.

In a preferred embodiment, HLL objects E 302, F 303, G 304, H 305 and D 301 could be subsystem emulators with special test generator interfaces. Additional HLL objects which could be added to the configuration of FIG. 3 include but are not limited to: delay elements, bus monitors, and protocol checkers. In the exemplary case of object HLL emulator D 301, communication between RTL object B 103 and RTL object C 104 now preferably passes through both HLL wrapper B 203 and HLL emulator D 301 and is directed to the appropriate object destination.

Figure 4:
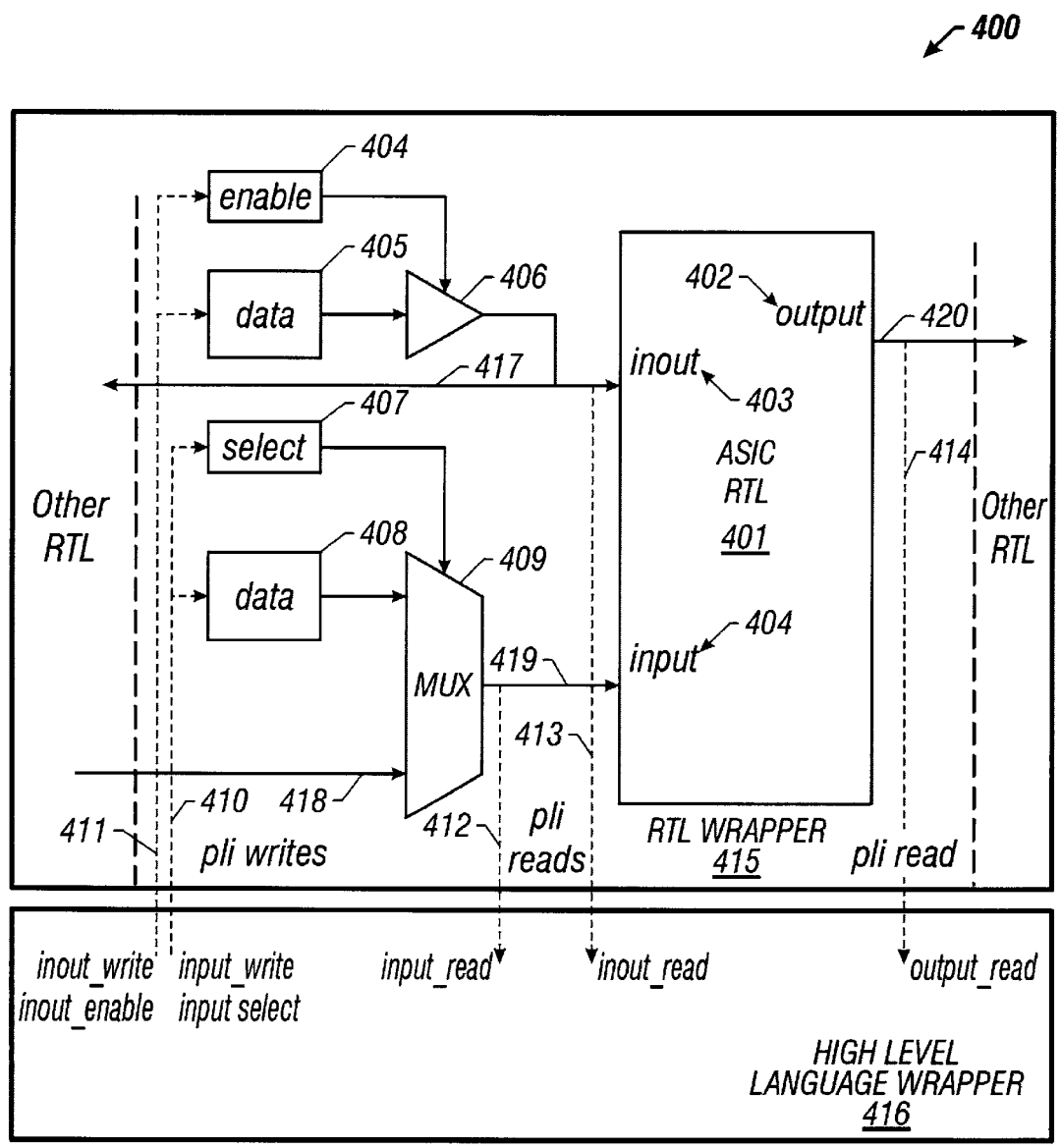
FIG. 4 depicts an RTL simulated ASIC in communication with a high level language wrapper according to a preferred embodiment of the present invention.

FIG. 4 depicts an arrangement 400 comprising an RTL simulated ASIC in communication with a high level language wrapper according to a preferred embodiment of the present invention. An RTL simulated ASIC 401 is shown connected to some additional RTL implemented devices which together form RTL wrapper 415. RTL wrapper 415 preferably communicates with high level language wrapper 416 employing appropriate interfaces between the two software entities.

In a preferred embodiment, when employing a hardware description language, such as, for instance, Verilog, at least three types of ports may be accessed. On ASIC RTL 401, inout port 403 is preferably a bi-directional port. A device with a bi-directional port may drive the port actively (to a logical 1 or 0) or leave the port tri-state in which case it will not drive the port. Preferably, RTL implemented logic is connected to, and drives, port 403. Dotted arrows 412–414 represent the Programming Language Interface (PLI) function calls which preferably enable bi-directional communication between RTL wrapper 415 and high level language wrapper 416.

In a preferred embodiment, two sets of registers are associated with inout port 403. These are the enable register 404 and the data register 405, both of which are preferably implemented in HDL. Dotted line 411 extends from enable register 404 and data register 405 down to high level language wrapper 416 and preferably represents two functions labeled inout_write and inout_enable.

In a preferred embodiment, inout_write and inout_enable are preferably variables in high level language code within high level language wrapper 416. These variables are preferably transmitted as signals to registers 404 and 405, when appropriate. Preferably, when the inout enable is transmitted to enable register 404, a signal, which may be either high or low, is transmitted from enable register 404 to tri-state driver 406. The inout_write variable preferably operates to transmit data along path 411 to data register 405. Preferably, when inout_write data is present at data register 405 and the enable 404 signal to tri-state device 406 is high, the inout_write data will be written to the inout port 403 on ASIC RTL 401.

In a preferred embodiment, data being communicated into and out of INOUT port 403 on path 417 may be examined by the high level language wrapper 416 via the use of programming language interface function call 413 depicted by a dotted line extending from path 419 to HLL wrapper 416 and designated inout_read. Path 417 preferably also enables communication between ASIC RTL 401 and at least one neighboring ASIC RTL. Accordingly, it may be seen that the embodiment of FIG. 4 permits the ASIC RTL 401 to optionally connect to other ASIC RTLs directly, in addition to being able to connect to such other ASIC RTLs employing high level language wrapper 416 as an intermediate point for communication with other ASIC RTLs.

In a preferred embodiment, RTL ASIC 401 includes an input port 404. Input port 404 is preferably able to receive data directly from another RTL ASIC or from HLL wrapper 416, although generally receiving data from only of these at any given time. HLL wrapper 416 preferably supplies data to data register 408 for communication through MUX 409 to input 404. Likewise, another RTL ASIC or other RTL device may communicate information through MUX 409 into input 404 employing communication path 418. Select data register 407 preferably controls MUX 409 and thereby preferably determines which of data register 408 and communication path 418 will supply data to input 404 at any given time. Once the data source selection is made at MUX 409, the selected data is preferably transmitted along path 419 to input 404. Programming language interface 412, represented by a dotted line extending from path 419 to HLL wrapper 416, preferably enables HLL wrapper 416 to monitor all data communicated into input 404 from whatever source.

In a preferred embodiment, RTL ASIC 401 preferably includes output port 402. Generally, the HLL wrapper 416 does not control registers to drive data into output port 402. Output communication path 420 is preferably able to transmit data to another RTL ASIC or other RTL device as well as to HLL wrapper 416. Output port 402 preferably communicates data to HLL wrapper 416 employing programming language interface function call 414 which is depicted as a dotted line extending from path 420 to HLL wrapper 416 and is labeled outpu_tread.

Figure 5:
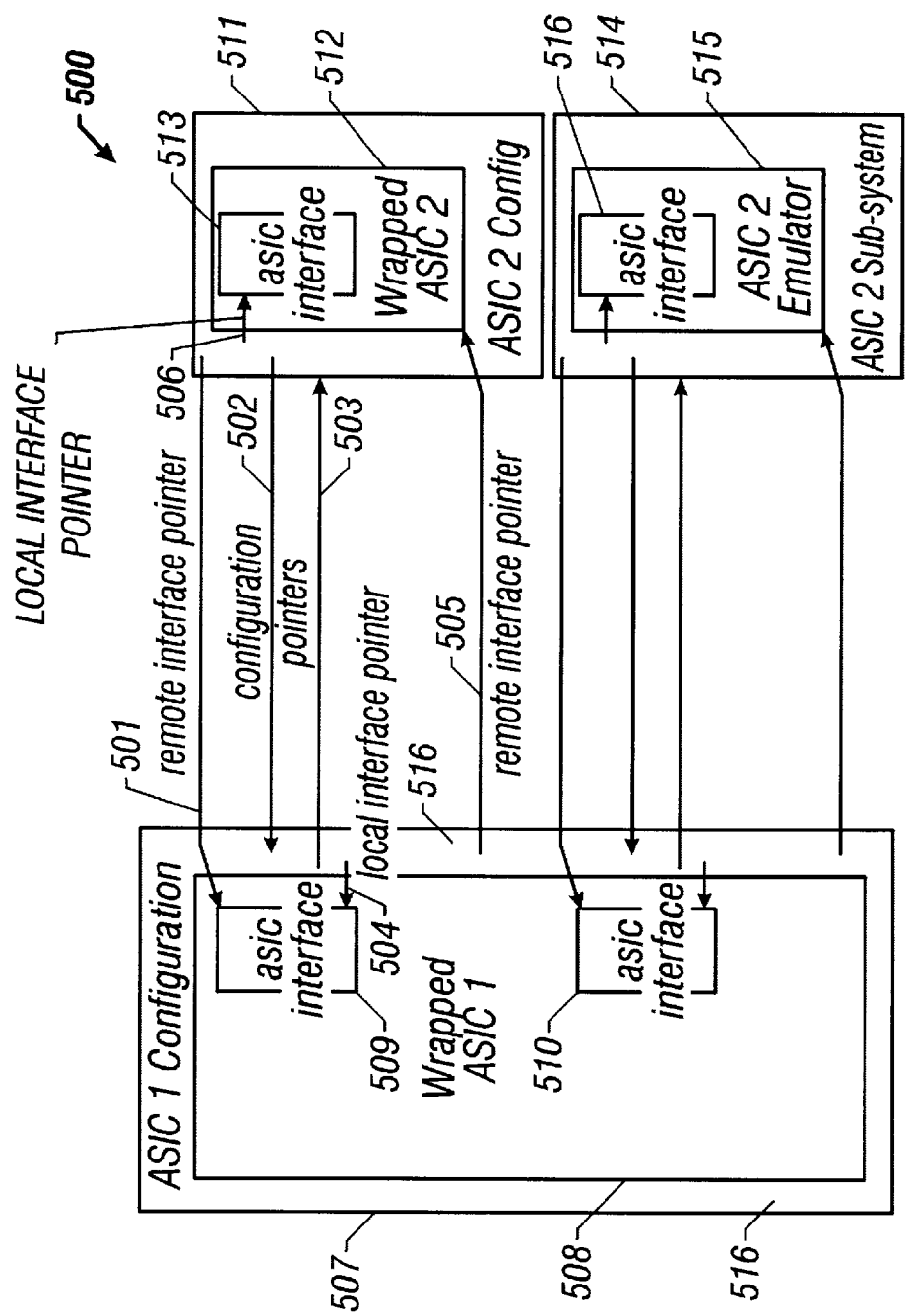
FIG. 5 depicts high level language structures and pointers beneficial for interconnecting a plurality of RTL implemented devices according to a preferred embodiment of the present invention.

FIG. 5 depicts an arrangement 500 comprising high level language structures and pointers beneficial for interconnecting a plurality of RTL implemented device according to a preferred embodiment of the present invention. Three components are represented, an ASIC 1 sub-system 507 including an ASIC implemented in RTL 508, ASIC 2 component 511 including an ASIC implemented in RTL 512, and an ASIC 2 sub-system 514 including an ASIC emulated entirely in a high level language 515, which high level language could be the "C" programming language.

In a preferred embodiment, two sets of three pointer relate ASIC object 507 and ASIC object 511. It will be appreciated that fewer or more than three pointers relate ASIC object 507 and ASIC object 511. It will be appreciated that fewer or more than three pointers may be employed and all such variations are included in the scope of the present invention. Object pointers 502 generally point from an originating object to a remote object. For example, object pointer 502 points from ASIC object 511 to ASIC object 507. A similar object pointer 503 preferably points in the reverse direction.

In a preferred embodiment, a second type of pointer points to an ASIC interface from high level language within the ASIC object. For example, local interface pointer 504 points to local ASIC interface 509 from high level language code on the local object. A similar function is performed by local interface pointer 506 for ASIC object 511. Generally, a third type of pointer is a remote interface pointer which points from high level language code on a local object to a wrapped ASIC interface located on a remote node. For example, remote interface pointer 505 points from the high level language code of ASIC 1 object 507 to the ASIC interface 513 within the ASIC 2 object 511.

In a preferred embodiment, local and remote interface pointers cooperate to properly direct information between different objects. An exemplary case is presented where ASIC 1 is considered "local" and ASIC 2 is considered "remote." Local interface pointer 504 and remote interface pointer 505 preferably cooperate in order to service communication between local ASIC interface 509 and remote ASIC interface 513.

An example is considered where data will be communicated from ASIC interface 509 to ASIC interface 513. In this case, ASIC 1 configuration HLL software 516 preferably operates as an intermediary between the two ASICs. HLL software 516 preferably acquires the data to be communicated by employing local interface pointer 504 to access an appropriate location at ASIC interface 509. HLL software 516 may temporarily store the data to be communicated or alternatively, may continuously acquire and retransmit the data to destination ASIC interface 513.

Continuing with the example, after acquiring the data to be communicated, HLL software 516 preferably employs remote interface pointer 505 to appropriately direct the data to ASIC interface 513. A transfer of data from ASIC 2 interface 513 to ASIC 1 interface 509 would preferably operate in reverse order to that described in the above example, and in a substantially parallel manner. Data transmission, in both directions, between ASIC interfaces 510 and 516 preferably operates in the same manner as described above for ASIC interfaces 509 and 513. Preferably, ASIC 2 emulator 515 operates substantially as does wrapped ASIC 512, except that emulator 516 is preferably implemented entirely with HLL code, whereas wrapped ASIC 512 preferably includes an RTL implemented ASIC which communicates with a HLL implemented "wrapper" as described elsewhere in this application.

Figure 6:
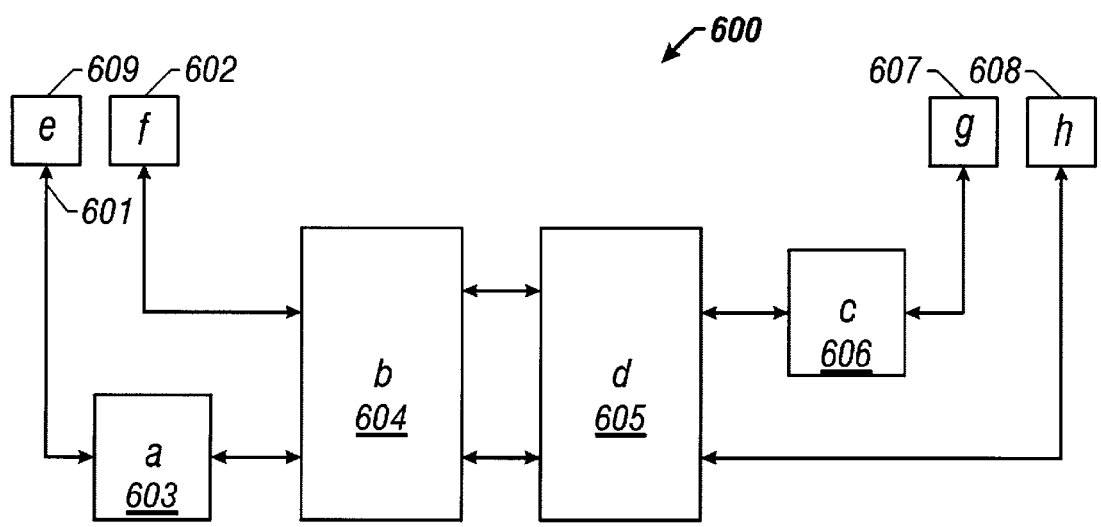
FIG. 6 depicts a set of nodes suitable for building the circuit depicted in FIG. 3 according to a preferred embodiment of the present invention.

FIG. 6 depicts a set of nodes suitable for building the circuit depicted in FIG. 3 according to a preferred embodiment of the present invention.

In a preferred embodiment, the arrowheads 601 represent pointers to a particular node, and optionally, to a port on the node if the node includes more than one port. Generally, bi-directional arrows indicate that the nodes at each end of the bi-directional arrows have pointers to each other (as if a single arrow were drawn in each direction). Preferably, each node, in addition to including remote node pointers, includes variables to identify the type of each node. For example, node a would preferably include information to the effect that it is a wrapper for an RTL ASIC type A. Node d would preferably include information specifying that it is an emulator for ASIC type D.

In a preferred embodiment, once structure 600 with the included nodes is generated, the system configuration may be built. In order to build the configuration, information pertaining to pointer information for one of the nodes is preferably provided to the dynamic configuration code. Preferably, the dynamic configuration code will then proceed from node to node, building and connecting the objects at each node to be included in a final modified configuration.

One possible algorithm for building each node preferably includes the following steps: i) building objects of a type specified by each node (emulator, wrapper, etc); ii) copying object interface pointers to node data structure for later use; iii) checking each node connection for another node; iii(a) if another node exists and is not built, recursively building the additional node which additional node becomes a "remote node" from a vantage point of the preceding node; iii(b) copying the remote node's interface pointers and providing information regarding such pointers to the preceding node; iv) checking each node connection for another node; iv(a) connecting this node's interface pointers to the copied remote node interface pointer. It will be appreciated that the algorithm described in the foregoing is recursive in nature.

In a preferred embodiment, other initialization which may be performed as needed during these stages may include the following. As an example, suppose the first node to be built is node A 603. The objects specified in node a 603 will preferably be built first. In this case, a wrapper is preferably constructed. To construct the wrapper, certain initialization steps will preferably be implemented. Specifically, the wrapper will preferably be provided with information regarding a path to its RTL counterpart for use in PLI (programming language interface) routines. Preferably, determination of this path may be achieved in a number of ways. A first way may include establishing a naming convention for mechanisms implemented in RTL that specify the path, to PLI-based routines which proceed through a set of RTL implemented modules to determine what modules are present.

Figure 7:
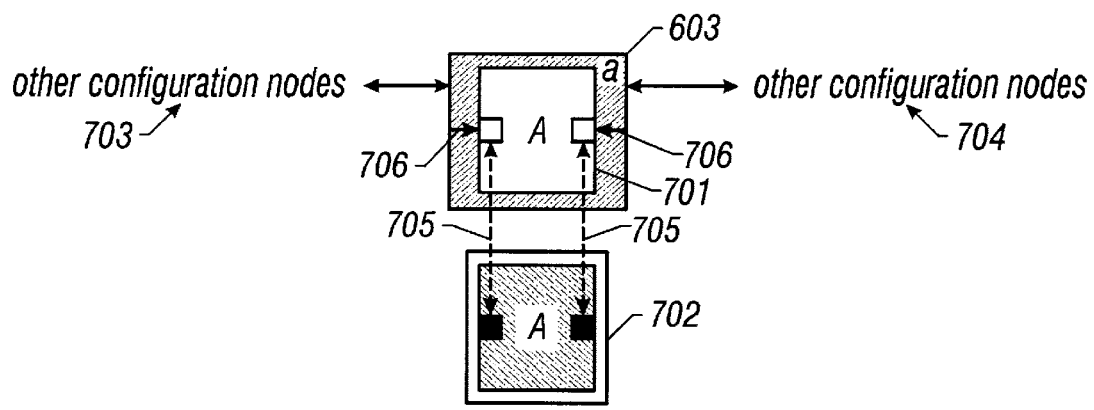
FIG. 7 depicts steps included in building a node according to a preferred embodiment of the present invention.

FIG. 7 depicts steps included in building a node according to a preferred embodiment of the present invention. The preferred results of step (i) above, including the creation of HLL wrapper 701 and the path initialization (designated 705) from the HLL wrapper 701 to RTL wrapper 702, via specification of its RTL path, is shown in FIG. 7. Note that wrapped RTL A 702 preferably exists prior to execution of step i. Preferably, in step ii, interface pointers 706 of objects created by node A 603 are copied to node 603.

Figure 8:
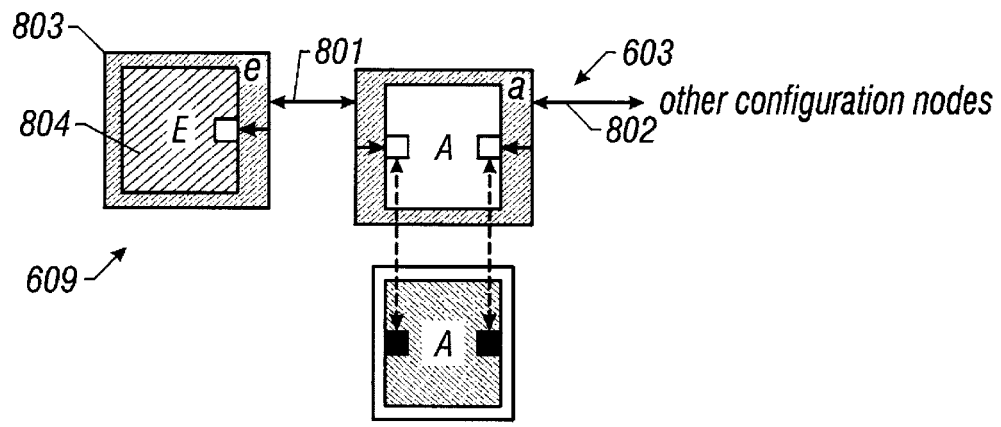
FIG. 8 depicts the results of building a node and copying a remote node's interface pointers according to a preferred embodiment of the present invention.

FIG. 8 depicts the results of building a node and copying a remote node's interface pointers according to a preferred embodiment of the present invention. In step iii, node pointer 801 on the left of node a 603 is preferably examined for the existence of another node. Preferably, the inventive method identifies the existence of node E 609 and determines that this node has not been built. Subsequently, node E is preferably built as described above in steps i and ii. After steps i and ii, as described above are executed, the progress of construction of an overall configuration includes the elements depicted in FIG. 8, where built node E is depicted by reference numeral 803. Preferably, a built node, such as built node 803, is defined to be a node that has created its associated wrapper, or emulator, such as emulator 804.

Figure 9:
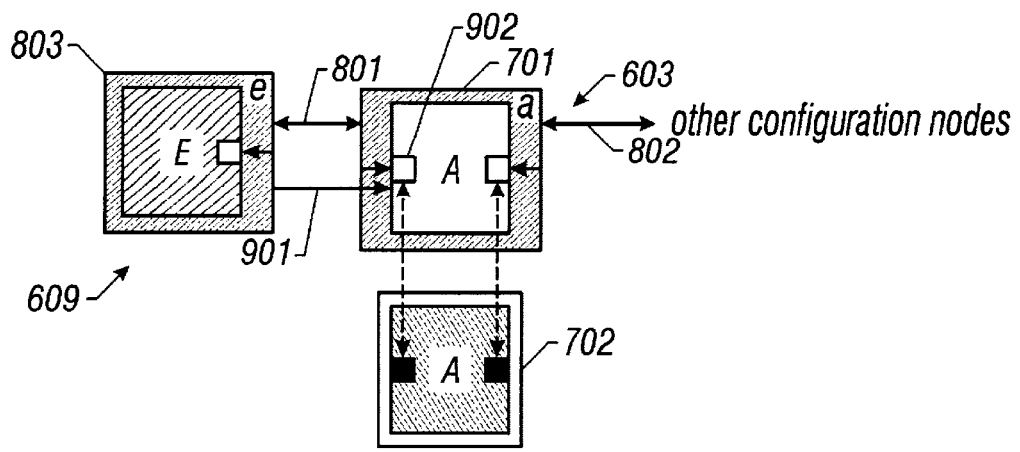
FIG. 9 depicts addition of an interface pointer to the configuration depicted in FIG. 8 according to a preferred embodiment of the present invention.

FIG. 9 depicts addition of an interface pointer 901 to the configuration depicted in FIG. 8 according to a preferred embodiment of the present invention. Upon processing step iii(a), as described above, node A 603, which is remote to node E 609, is preferably detected. However, since node a 603 has generally been built at this stage of the build method, the dynamic configuration code preferably proceeds to step iii(b) at which point remote node A's 701 pointer to interface 902 is copied, creating pointer 901.

Figure 10:
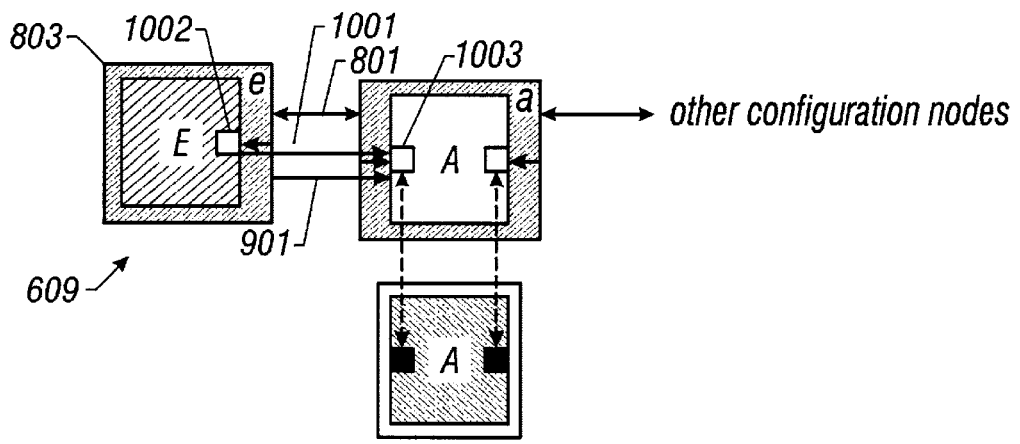
FIG. 10 depicts the connection of object E's interface to the remote interface according to a preferred embodiment of the present invention.

FIG. 10 depicts the connection of object E's interface 1002 to the remote interface 1003 according to a preferred embodiment of the present invention. In step iv(a), connection 1001 is created by giving E's local interface 1002 a copy of the remote interface pointer 901.

Figure 11:
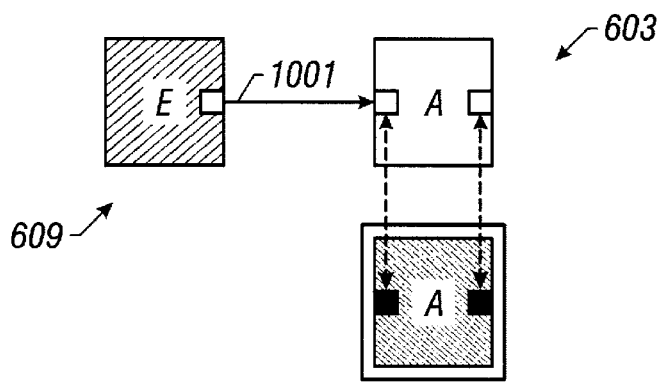
FIG. 11 depicts HLL and RTL objects in an intermediate stage of configuration construction upon removal of configuration nodes and pointer indicators according to a preferred embodiment of the present invention.

FIG. 11 depicts HLL and RTL objects in an intermediate stage of configuration construction upon removal of configuration nodes and pointer indicators according to a preferred embodiment of the present invention. Preferably, at this point, node E 609 construction is complete. The dynamic configuration code preferably then attends, by virtue of recursion, to node A 603 where it performs step iii(b) and copies the interface pointer from node E 609. Next, the dynamic configuration code preferably repeats steps iii for node A's second interface. Since node B 604 would generally not have been built at this point in the process, node B 604 build is preferably initiated. Likewise, node B 604 will preferably construct its objects, and check its ports, thus causing other nodes connected to node B 604 to be built. Eventually, node B 604 build will preferably be completely built and connected. At this point, control returns back to node A 603, where it proceeds to execute step iii(b), as described above.

Figure 12:
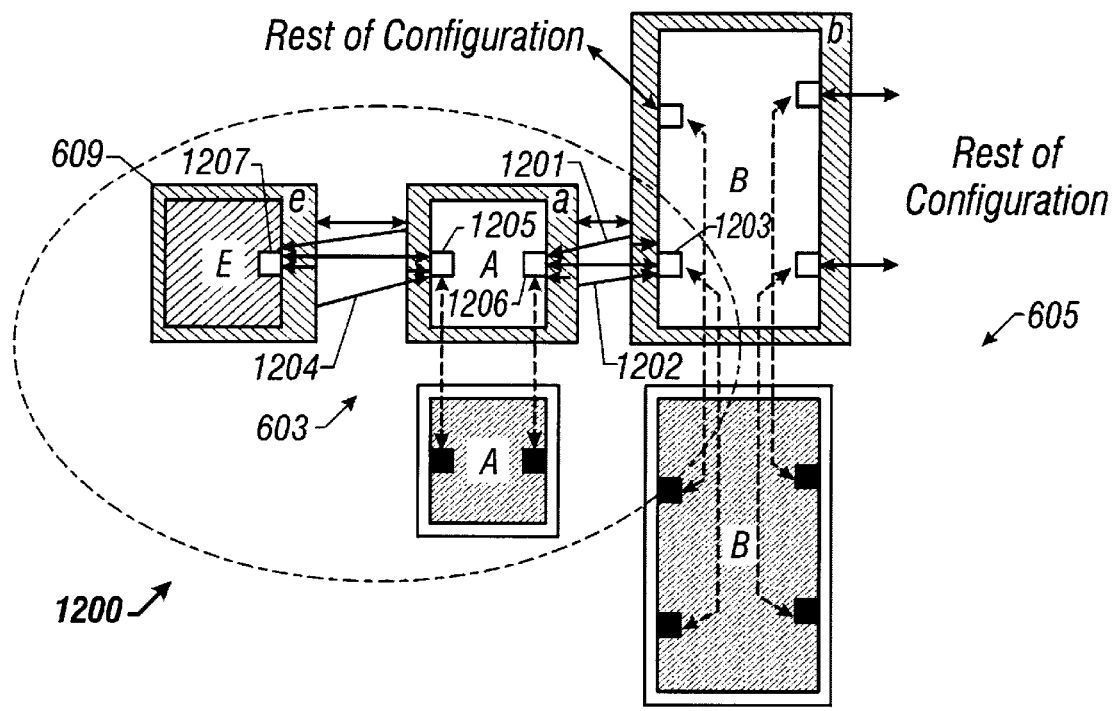
FIG. 12 depicts an area of interest around a node during construction of a simulated circuit according to a preferred embodiment of the present invention.

FIG. 12 depicts an area of interest 1200 around node A during construction of a simulated circuit.

In a preferred embodiment, in step iii(b), node A 603 copies the pointer to lower left interface 1203 of node B 605 creating pointer 1202. In step iv, node A preferably processes both ports again. This time, it preferably connects its local interface pointer for each port with the remote interface pointers 1202 and 1204 it copied from the remote nodes. It is noted that object A's left interface 1205 now points to object E's interface 1207, and object A's right interface 1206 is pointing to object B's lower-left interface 1203.

Figure 13:
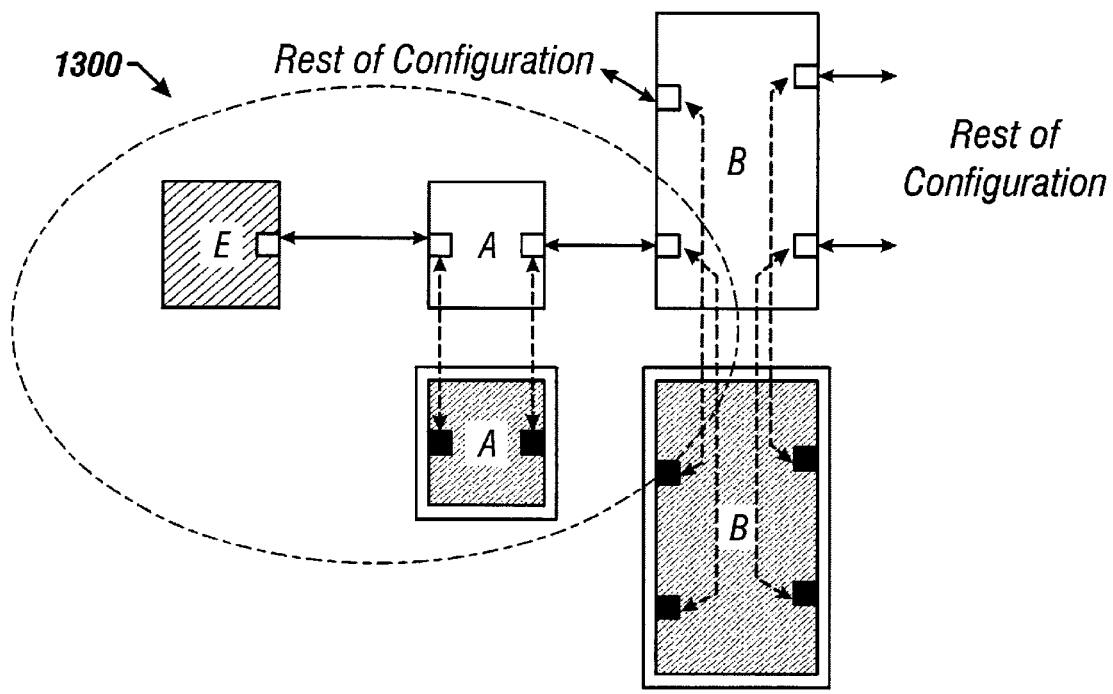
FIG. 13 depicts HLL and RTL objects remaining upon removal of a dynamic configuration infrastructure shown in FIG. 12 according to a preferred embodiment of the present invention.

FIG. 13 depicts HLL and RTL objects remaining upon removal of a dynamic configuration infrastructure shown in FIG. 12 according to a preferred embodiment of the present invention. FIG. 13 generally represents a subset of the configuration depicted in FIG. 3. Most of the rest of the configuration depicted in FIG. 3 may be built according to the steps outlined above for the configuration subset 1300 depicted in FIG. 13. Preferably, once the above steps are repeated for the various nodes depicted in FIG. 13, the configuration of FIG. 13 would generally be duplicated except for the pointers between the test generator and certain objects in the configuration. Moreover, the missing pointers could generally be established by having the dynamic configuration code pass the node pointers to the test generator.

Figure 14:
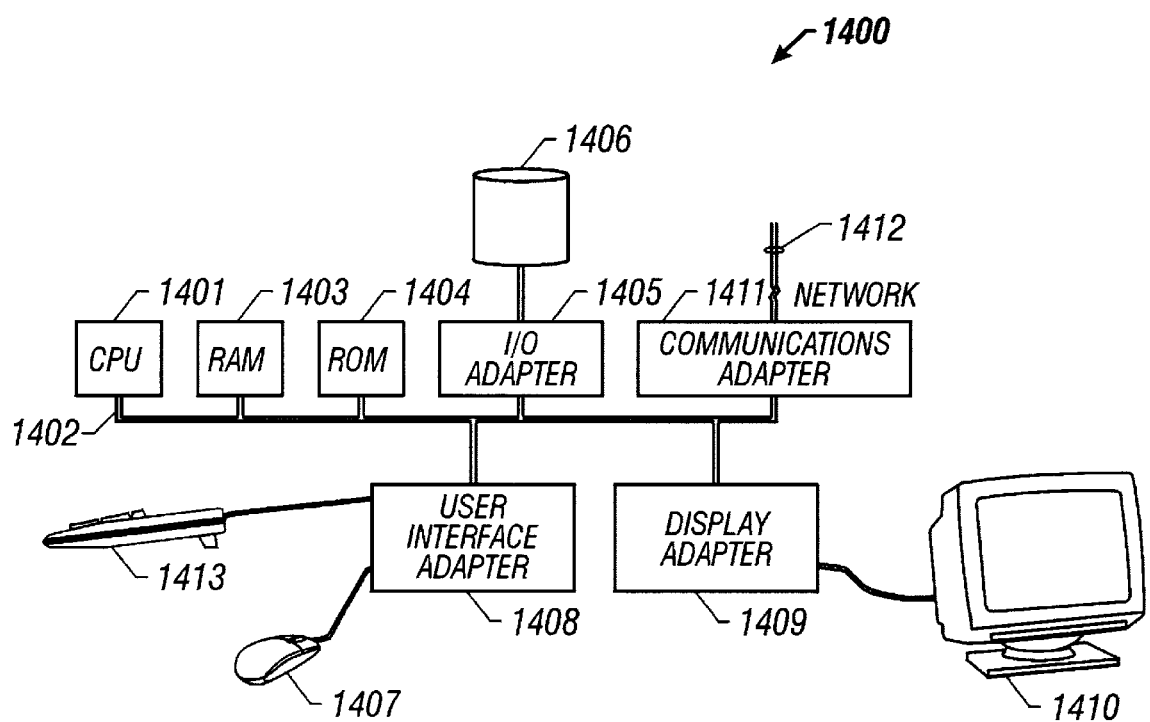
FIG. 14 depicts a block diagram of a computer system which is adapted to use the present invention.

FIG. 14 illustrates computer system 1400 adaptable for use with a preferred embodiment of the present invention. Central processing unit (CPU) 1401 is coupled to system bus 1402. The CPU 1401 may be any general purpose CPU, such as an HP PA-8200. However, the present invention is not restricted by the architecture of CPU 1401 as long as CPU 1401 supports the inventive operations as described herein. Bus 1402 is coupled to random access memory (RAM) 1403, which may be SRAM, DRAM, or SDRAM. ROM 1404 is also coupled to bus 1402, which may be PROM, EPROM, or EEPROM. RAM 1403 and ROM 1404 hold user and system data and programs as is well known in the art.

The bus 1402 is also coupled to input/output (I/O) adapter 1405, communications adapter card 1411, user interface adapter 1408, and display adapter 1409. The I/O adapter 1405 connects to storage devices 1406, such as one or more of hard drive, CD drive, floppy disk drive, tape drive, to the computer system. Communications adapter 1411 is adapted to couple the computer system 1400 to a network 1412, which may be one or more of local (LAN), wide-area (WAN), Ethernet or Internet network. User interface adapter 1408 couples user input devices, such as keyboard 1413 and pointing device 1407, to the computer system 1400. The display adapter 1409 is driven by CPU 1401 to control the display on display device 1410.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A dynamic circuit simulation system, the system comprising:
    a plurality of register transfer level (RTL) objects;
    at least one high level language (HLL) wrapper for wrapping at least one of said RTL objects, thereby establishing wrapped RTL objects; and
    a plurality of dynamically reconfigurable pointers for linking said each wrapped object to other devices in a simulation circuit configuration.

2. The dynamic circuit simulation system of claim 1, wherein said plurality of RTL objects comprises:
    at least one RTL implemented application specific integrated chip (ASIC).

3. The dynamic circuit simulation system of claim 1, wherein each wrapped RTL object comprises:
    at least one port for communicating with said other devices in said simulation circuit configuration.

4. The dynamic circuit simulation system of claim 3, wherein said plurality of pointers links said at least one port of said wrapped RTL objects.

5. The dynamic circuit simulation system of claim 1, wherein the plurality of pointers linking each wrapped object comprises:
    a node pointer for identifying a node remote from said each object;
    a remote interface pointer for pointing from HLL code in said each object to a port on an object at a remote node in said simulation circuit configuration; and
    a local interface pointer for pointing from said HLL code in said each object to a port local to said each wrapped object.

6. The dynamic circuit simulation system of claim 1, further comprising:
    an input port disposed on each of said RTL objects; and
    an output port disposed on each of said RTL objects.

7. The dynamic circuit simulation system of claim 6, further comprising:
    programming language interface function calls disposed on each of said RTL objects for linking said input port and said output port to said HLL wrapper.

8. The dynamic circuit simulation system of claim 6, further comprising:
    a bi-directional port disposed on each of said RTL objects;
    a programming language interface call for linking said bi-directional port to said HLL wrapper; and
    an RTL data path for directly linking said bi-directional port to another RTL object in said simulation circuit configuration.

9. A method for providing a dynamically reconfigurable simulation circuit, the method comprising the steps of:
    disposing a plurality of RTL objects within said simulation circuit;
    intercepting communication between said RTL objects employing a wrapper implemented in HLL code for each said RTL object, thereby establishing HLL wrappers;
    linking communication between said plurality of RTL objects employing pointers referenced by said HLL wrappers, thereby establishing HLL interconnection links; and
    providing access to said HLL interconnection links.

10. The method of claim 9, further comprising the step of:
    transferring data from a first RTL object to a first HLL wrapper, linked to said first RTL object, employing a first local interface pointer.

11. The method of claim 10, further comprising the step of:

transferring data from said first HLL wrapper to a second HLL wrapper employing a remote interface pointer.

12. The method of claim 11, further comprising the step of:

transferring data from said second HLL wrapper to a second RTL object employing a second local interface pointer.

13. The method of claim 9, wherein said step of intercepting comprises:

disposing an input port on an RTL object of said RTL objects; and disposing an output port on said RTL object.

14. The method of claim 13, wherein the step of intercepting further comprises:

employing programming language interface function calls to conduct communication between said ports to an HLL wrapper linked to said RTL object.

15. A method for building a dynamic system configuration, the method comprising the steps of:

establishing a plurality of linked configuration nodes;

specifying an object to be built at each node of said nodes;

building the specified object at a first node of said nodes;

detecting whether any node is connected to said first node;

where a node is detected, building said connected detected node; and copying interface pointers of said connected detected node.

16. The method of claim 15, comprising the further step of:

repeating said steps of detecting, building, and copying until all of said linked configuration nodes are built.

17. The method of claim 16, wherein the step of building comprises:

establishing a data path between an RTL device and an HLL wrapper for said RTL device to enable communication between said device and said wrapper.

18. The method of claim 17, wherein the step of establishing a data path comprises:

scanning the RTL device to identify modules present in said RTL device.

19. The method of claim 17, wherein the step of establishing a data path comprises:

establishing at least one RTL port in said RTL device; and establishing at least one HLL port in said HLL wrapper for said RTL device.

20. The method of claim 17, further comprising the step of:

implementing said HLL wrapper in C language code.

* * * * *